United States Patent
Knapp et al.

(10) Patent No.: US 8,719,758 B1
(45) Date of Patent: May 6, 2014

(54) METHODS AND APPARATUS FOR AUTOMATED WIRING DIAGRAM GENERATION

(71) Applicant: Custom Virtual Environments, Inc., Brookline, MA (US)

(72) Inventors: Jonathan Knapp, Brookline, MA (US); Thomas Coffin, St. Petersburg, FL (US); Christopher Jaffe, Lake Park, FL (US)

( * ) Notice: Subject to any disclaimer, the term of this patent is extended or adjusted under 35 U.S.C. 154(b) by 0 days.

(21) Appl. No.: 13/624,425

(22) Filed: Sep. 21, 2012

Related U.S. Application Data

(60) Provisional application No. 61/538,632, filed on Sep. 23, 2011.

(51) Int. Cl.
*G06F 17/50* (2006.01)
(52) U.S. Cl.
USPC .......................... 716/126; 716/118
(58) Field of Classification Search
USPC .................. 716/100, 118, 119, 126; 703/3–4, 703/13–14; 361/760; 439/43–50, 59–62; 715/100, 118, 119, 126
See application file for complete search history.

(56) References Cited

U.S. PATENT DOCUMENTS

| | | | | |
|---|---|---|---|---|
| 6,377,285 B1 * | 4/2002 | Doan et al. | ..................... | 715/764 |
| 6,389,437 B2 * | 5/2002 | Stoub | ............................ | 715/201 |
| 6,438,435 B1 * | 8/2002 | Wada et al. | ..................... | 700/97 |
| 7,984,413 B2 * | 7/2011 | Orita et al. | ..................... | 716/137 |
| 8,201,136 B2 * | 6/2012 | Kumagai | ..................... | 716/139 |

* cited by examiner

*Primary Examiner* — Nghia Doan
(74) *Attorney, Agent, or Firm* — Steven H. Greenfield; Greenfield Invention and Patent Consultity, Inc.

(57) ABSTRACT

The invention provides, in some aspects, a method of automated diagram generation that includes inputting a description of a plurality of entities and connectivity relationships in which those entities participate with one another; assigning the entities to each of one or more groups groups; assigning the entities to each of one or more columns, each of which has one or more lanes; determining a candidate layout of columns for placement into one or more workspaces based on widths assigned to those columns; assigning connectivity relationships of one or more entities in at least one column to each of one or more lanes based on the column(s) to which entities participating in those connectivity relationships are assigned; assigning widths to at least one of the columns as a function of those lane assignments; and outputting a representation of that candidate layout.

26 Claims, 17 Drawing Sheets

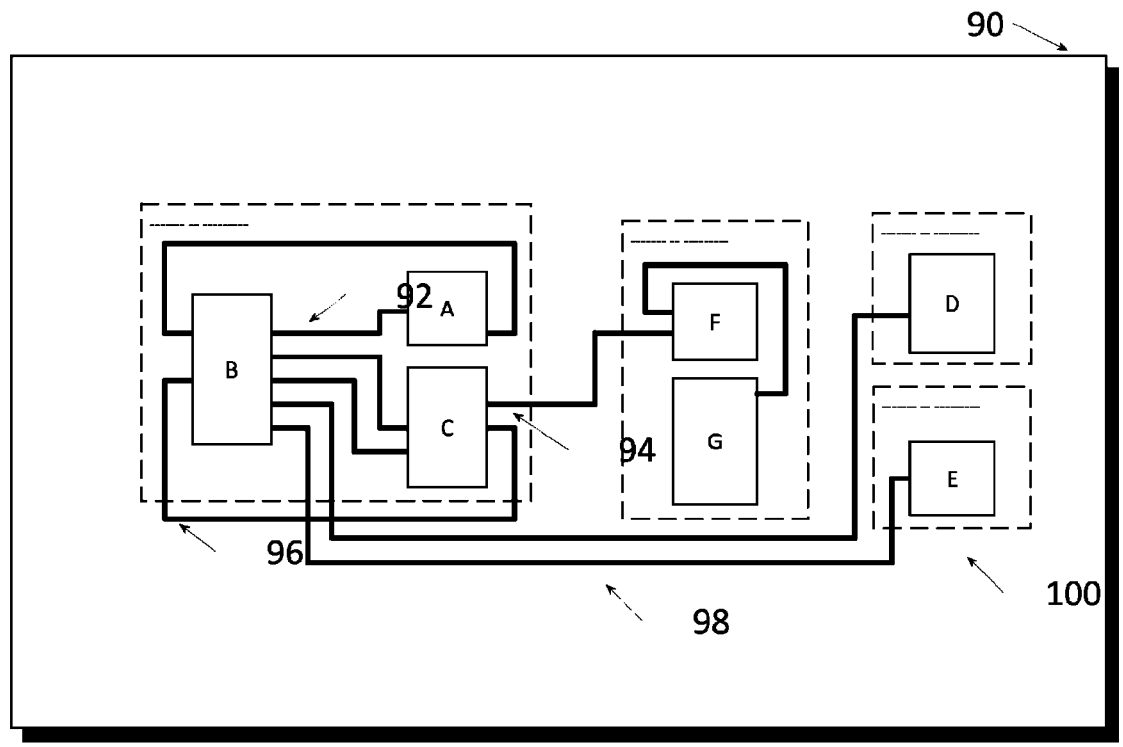
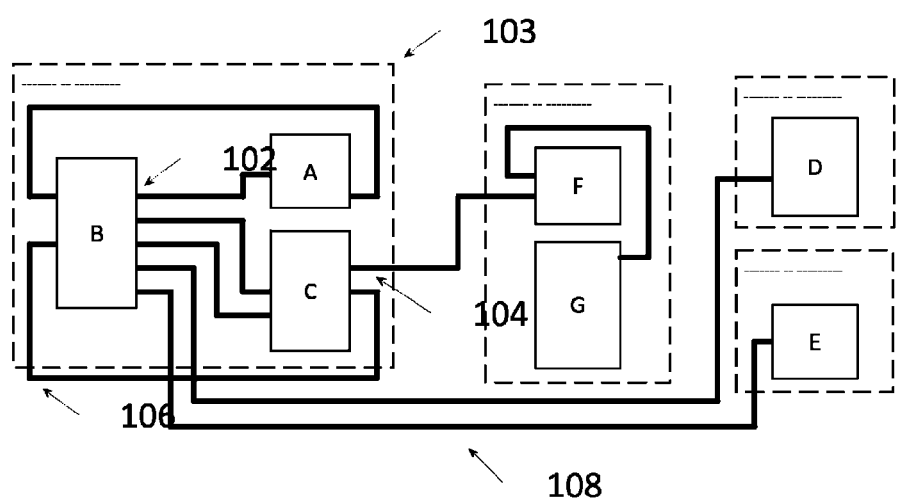
Figure 5

Devices  200

| Columns: | Column Type: |
|---|---|
| Device_id | INTEGER PK |
| Location_id | INTEGER |
| Page_id | INTEGER |
| Column_id | INTEGER |
| Shape_id | INTEGER |
| Input_Count | INTEGER |
| Output_Count | INTEGER |
| Device_Name | TEXT |
| Manufacturer | TEXT |
| Model_Number | TEXT |
| Height | REAL |
| Width | REAL |
| Pin_X | REAL |
| Pin_Y | REAL |

Connection_Points  202

| Columns: | Column Type: |
|---|---|
| Connection_Point_id | INTEGER PK |
| Device_id | INTEGER |
| Shape_id | INTEGER |
| Directional_Classification | TEXT |
| Signal_Type | TEXT |
| System_Classification | TEXT |
| Connnection_Name | TEXT |
| Connection_Color | TEXT |
| Connection_Position | INTEGER |

Group_Boundaries  204

| Columns: | Column Type: |
|---|---|
| Boundary_id | INTEGER PK |
| Group_id | INTEGER |
| Page_id | INTEGER |
| Shape_id | INTEGER |
| Title_Text | TEXT |
| Pin_X | REAL |
| Pin_Y | REAL |
| Width | REAL |
| Height | REAL |
| X1 | REAL |
| Y1 | REAL |
| X2 | REAL |
| Y2 | REAL |
| Is_Split_Group | INTEGER |

Figure 10

Locations    ⟵ 210

| Columns: | Column Type: |
|---|---|
| Location_id | INTEGER PK |
| Location_Name | TEXT |
| Page_id | INTEGER |
| Member_Count | INTEGER |
| Width | REAL |
| Height | REAL |
| Pin_X | REAL |
| Pin_Y | REAL |

Group_Pairs    ⟵ 212

| Columns: | Column Type: |
|---|---|
| Group_Pair_id | INTEGER PK |
| Group_1_id | INTEGER |
| Group_2_id | INTEGER |
| Cable_Count | INTEGER |

Device_Pairs    ⟵ 214

| Columns: | Column Type: |
|---|---|
| Device_Pair_id | INTEGER PK |
| Input_Device_id | INTEGER |
| Output_Device_id | INTEGER |
| Cable_Count | TEXT |

Columns    ⟵ 216

| Columns: | Column Type: |
|---|---|
| Column_id | INTEGER PK |
| Page_id | INTEGER |
| Group_id | INTEGER |
| Sub_Group_id | INTEGER |
| Column_Width | REAL |
| Column_Height | REAL |
| Left_Lanes_Count | INTEGER |
| Right_Lanes_Count | INTEGER |
| Top_Symbol_Starts_Y | REAL |
| Bottom_Symbol_Ends_Y | REAL |
| Column_Position | INTEGER |
| Pin_X | REAL |

Figure 11

Pages
← 218

| Columns: | Column Type: |
|---|---|
| Page_id | INTEGER PK |
| Page_Name | TEXT |
| Section_Number | REAL |
| Document_Page_Number | INTEGER |
| Section_Page_Number | INTEGER |

Cables
← 220

| Columns: | Column Type: |
|---|---|
| Cable_id | INTEGER PK |
| From_Device_id | INTEGER |
| From_Connection_Point_id | INTEGER |
| To_Device_id | INTEGER |
| To_Connection_Point_id | INTEGER |
| Input_Jump_id | INTEGER |
| Output_Jump_id | INTEGER |
| Signal_Type | TEXT |
| Routing_Type | TEXT |
| System_Classification | TEXT |
| Input_Connection_X | REAL |
| Input_Connection_Y | REAL |
| Output_Connection_X | REAL |
| Output_Connection_Y | REAL |
| Line_Color | TEXT |
| Line_Style | TEXT |
| Shape_id | INTEGER |

Page_Jumps
← 222

| Columns: | Column Type: |
|---|---|
| Jump_id | INTEGER PK |
| Cable_id | INTEGER |
| Local_Page_id | INTEGER |
| Remote_Page_id | INTEGER |
| Local_Device_id | INTEGER |
| Remote_Device_id | INTEGER |
| Local_Shape_id | INTEGER |
| Remote_Shape_id | INTEGER |
| Local_Jump_Text | TEXT |
| Remote_Jump_Text | TEXT |
| Pin_X | REAL |
| Pin_Y | REAL |
| Directional_Classification | TEXT |

Figure 12

Lanes   230

| Columns: | Column Type: |
|---|---|
| Lane_id | INTEGER PK |
| Column_id | INTEGER |
| Page_id | INTEGER |
| Segment_id | INTEGER |
| Cable_id | INTEGER |
| Orientation | TEXT |
| X | FLOAT |
| Y1 | FLOAT |
| Y2 | FLOAT |
| Y | FLOAT |
| X1 | FLOAT |
| X2 | FLOAT |
| Lane_Relative | INTEGER |
| Lane_Absolute | INTEGER |

Rules   232

| Columns: | Column Type: |
|---|---|
| Rule_id | INTEGER PK |
| Rule_Name | TEXT |
| Enable | INTEGER |

Conditions   234

| Columns: | Column Type: |
|---|---|
| Condition_id | INTEGER PK |
| Test_xml | TEXT |
| Result_Text | TEXT |
| Result_Numeric | REAL |
| Result_Type | TEXT |
| Workspace | TEXT |

Figure 13

Factors 236

| Columns: | Column Type: |
|---|---|
| Factor_id | INTEGER PK |
| Parent_Condition_id | INTEGER |
| Child_Condition_id | INTEGER |
| Result_Text | TEXT |
| Result_Numeric | REAL |
| Result_Type | TEXT |
| Attribute | TEXT |

Actions 238

| Columns: | Column Type: |
|---|---|
| Action_id | INTEGER PK |
| Requisite_Condition_id | INTEGER |
| Is_condition_true | INTEGER |
| Action_xml | TEXT |
| Action_Type | TEXT |
| Workspace | TEXT |
| Action_Result | INTEGER |
| Action_Notes | TEXT |

Attributes 240

| Columns: | Column Type: |
|---|---|
| Attribute_id | INTEGER PK |
| Device_id | INTEGER |
| Connection_Point_id | INTEGER |
| Cable_id | INTEGER |
| Location_id | INTEGER |
| Attribute | TEXT |

Figure 14

System / User Preference Values

| Value Names: |
|---|
| Default Device Width |
| Default Vertical Space Between Devices within Column |
| Lane Spacing |
| Minimum Horizontal Space Between Columns |
| Page Width |
| Page Height |
| Top Page Margin |
| Bottom Page Margin |
| Left Page Margin |
| Right Page Margin |
| Page Scaling Factor |
| Page Scale |
| Page Jump Width |
| Device Top Vertical Allowance |
| Device Bottom Vertical Allowance |

METHODS AND APPARATUS FOR AUTOMATED WIRING DIAGRAM GENERATION

BACKGROUND OF THE INVENTION

This application claims the benefit of filing of U.S. Patent Application Ser. No. 61/538,632, filed Sep. 23, 2011, the teachings of which are incorporated herein by reference.

The invention pertains to digital data processing and, particularly, for example, to automated diagram generation. The invention has application in the automated generation of wiring and other diagrams.

Wiring diagrams, plumbing diagrams and other such schematics are useful, if not critical, to the layout and maintenance of home, office and industrial facilities, to name a few applications. As regards wiring diagrams, for example, those drawings typically employ simplified shapes to represent circuit components and lines to reflect the electrical connections between them. Some such diagrams include additional elements, e.g., reflecting the physical and/or positional relationships among and between the circuit components, as well as to structures such as cabinets, buildings, geography in which they are (or will be) placed. Plumbing diagrams and other such schematics similarly employ simplified depictions of components and their interrelationships.

The art is replete with drawing software packages that facilitate the production of wiring diagrams, plumbing diagrams and other such schematics. Examples include Visio, OmniGraffle, to name but a few. Typically, users employ those packages to draw their diagrams "by hand," that is, by manipulating icons on a computer screen representing individual circuit, plumbing and other components and the connections (or other relationships) therebetween. Though, some software packages facilitate drawing preparation by permitting users to input text (and other) files pre-identifying such components and their connections (or relationships), this typically proves no better than "semi-automated" diagram generation—since, it is typically necessary for the user rearrange icons corresponding to the pre-identified components in order to properly position (and, sometimes, connect) them.

An object of the invention is to provide improved methods and apparatus for digital data processing.

A further object is to provide such improved methods and apparatus for diagram generations.

A still further object of the invention is to provide such improved methods and apparatus as facilitate the generation of wiring diagrams.

Yet a still further object of the invention is to provide such improved methods and apparatus as can be implemented on conventional digital data processing equipment.

SUMMARY OF THE INVENTION

The aforementioned and other objects are attained by the invention which provides, in some aspects, a method of automated diagram generation that includes inputting a description of a plurality of entities (e.g., electronic circuit components) and connectivity relationships in which those entities participate with one another (e.g., wiring connections between the entities); assigning the entities to each of one or more groups; assigning the entities to each of one or more columns, each of which has one or more lanes; determining a candidate layout of columns for placement into one or more workspaces based on widths assigned to those columns; assigning connectivity relationships of one or more entities in at least one column to each of one or more lanes based on the column(s) to which entities participating in those connectivity relationships are assigned; assigning widths to at least one of the columns as a function of those lane assignments; repeating the column-assignment, layout-determining, and connectivity relationship-assignment steps to find a candidate layout that has a placement that fits into one or more workspaces; and outputting (e.g., printing or displaying on computer screen) a representation of that candidate layout.

Further aspects of the invention provide a method of automated diagram generation, e.g., as described above, that includes outputting the representation of the candidate layout such that one or more of the connectivity relationships is depicted by a symbol representing a wire; each workspace is placed on a separate respective page or display; one or more of the entities is depicted by a symbol representing an electronic device; one or more of the groups depict a physical location where electronic devices are located; each entity includes one or more symbols representing ports that depict the termination of one or more connectivity relationships; one or more of ports represent electrical or electronic connectors; and/or the candidate depicts an electronic schematic—all by way of non-limiting example.

Still further aspects of the invention provide a method of automated diagram generation, e.g., as described above, that includes inputting the description of the plurality of entities and their connectivity relationships using a graphical user interface. A related aspect includes inputting and/or parsing that description from a file, e.g., containing programming instructions for a home automation or other control system.

Yet still further aspects of the invention provide a method of automated diagram generation, e.g., as described above, in which one or more of the entities include ports, and wherein the description-inputting step includes assigning designations to those ports and the representation-outputting step includes outputting the representation of the candidate layout with text or other symbols based on those designations.

Still yet further aspects of the invention provide a method of automated diagram generation, e.g., as described above, that includes assigning ranks to each of one or more pairings of entities within each of one or more groups, wherein the ranks are assigned as a function of a number of connectivity relationships in which the entities in each pairing jointly participate.

Yet further aspects of the invention provide a method of automated diagram generation, e.g., as described above, that includes iteratively assigning positions to lanes in order to prevent lanes that are assigned to different respective connectivity relationships from having a same position in a representation of a candidate layout.

Still other aspects of the invention provide a method of automated diagram generation, e.g., as described above, that includes assigning and/or re-assigning each connectivity relationship to a routing type selected from a group of routing types that includes the types "In Group Adjacent," "In Group," "Remote Group," "Remote Group Jump," "Split Group Jump." In related aspects, the method can sort connectivity relationships based on those types. In further related aspects, the method can include at least partially determining column widths based on the number of connectivity relationships within each routing type.

Yet further aspects of the invention provide a method of automated diagram generation, e.g., as described above, that includes one or more of the steps of inputting from the user a list of signal types to be displayed, assigning a signal type to each port, filtering ports to be displayed based on the list of signal types, assigning a signal type to each connectivity relationship, filtering connectivity relationships to be displayed based on the list of signal types, and adjusting a candidate layout based on the ports and connectivity relationships.

Other aspects of the invention provide a method of automated diagram generation, e.g., as described above, that includes inputting (e.g., from a user) a page size and/or page scaling factor, determining an available workspace area based on that size and/or factor, and/or checking if a largest entity representation will fit with available workspace area.

Other aspects of the invention provide a method of automated diagram generation, e.g., as described above, that includes assigning page jumps to connectivity relationships that connect entities on different workspaces, and/or calculating column widths and lane assignments for columns that are associated with connectivity relationships that have been assigned jumps.

Further aspects of the invention provide a method of automated diagram generation, e.g., as described above, that includes splitting a group such that the entities therein are placed on different respective workspaces. Related aspects of the invention provide such a method that assigns a split group jump designation to a connectivity relationship directed to two (or more) entities that are in such a split group.

Yet still other aspects of the invention provide a method of automated diagram generation, e.g., as described above, that performs the group-assigning step, the column-assigning step, the candidate layout-determining step, the connectivity relationship-assigning step, the width-assigning step, and/or the outputting step in accord with a filter that is based on signal or other type.

Still yet other aspects of the invention provide a method of automated diagram generation, e.g., as described above, that outputs one or more of: a schedule of connectivity relationships depicted in an output candidate layout sorted by identifier (e.g., "cable number"), a schedule of connectivity relationships depicted in an output candidate layout sorted by location (e.g., cabinets, buildings, geography), identifiers for wiring or other connectivity relationships realized in the candidate layout (e.g., wire labels), a bill of materials for electrical components, wiring, etc., realized in the candidate layout, an enumeration of IP addresses for electrical components, etc., realized in the candidate layout, a cable connector list for a layout realized in the candidate layout, power requirements for a candidate layout.

Yet still other aspects of the invention provide a method of automated diagram generation, e.g., as described above, that prioritizes placement of groups into workspaces based on numbers of entities participating in connectivity relationships within those groups. Related aspects of the invention provide such a method that identifies pairs of groups that have one or more entities participating in mutual connectivity relationships and that ranks such pairs as a function of the numbers of those relationships.

Yet still other aspects of the invention provide a method of automated diagram generation, e.g., as described above, that defines entities and/or connectivity relationships (e.g., above and beyond those specified in the description) as a function of one or more rules. Related aspects of the invention provide such a method which defines such "supplemental" entities and/or supplemental relationships to add entities that are implied and/or required by those entities and/or connectivity relationships specified in the description. This can include, by way of non-limiting example, adding loudspeakers, electrical power strips, network hubs, ethernet connections, and so forth, in order to generate a more robust candidate layout.

In other aspects, the invention provides such a method of automated diagram generation, e.g., as described above, as permits the import of control system "programming"—e.g., programming from Crestron or other lighting and environmental and other control systems—and the generation therefrom of wiring diagrams.

Related aspects of the invention provide such a method of automated diagram generation, e.g., as described above, as parses such imported programming definitions to identify nodes (e.g., components) that are being connected to one another.

Further related aspects of the invention provide such a method of automated diagram generation, e.g., as described above, as identifies optimal wiring paths for connecting those nodes, taking to account predefined or user-defined constraints.

Further related aspects of the invention provide such a method of automated diagram generation, e.g., as described above, as determines wiring paths based on algorithmic analysis that includes grouping by location, determining which groups fit on which pages, and/or managing page jumps for paths that cross pages.

Further related aspects of the invention provide such a method of automated diagram generation, e.g., as described above, as generates from the foregoing a database that stores a raw page-by-page description of the wiring diagram and its components.

Further related aspects of the invention provide such a method of automated diagram generation, e.g., as described above, as generates from the raw description database an XML (or other markup language) description of the wiring diagram pages.

Further related aspects of the invention provide such a method of automated diagram generation, e.g., as described above, as utilizes the foregoing XML description on a variant thereof as a direct input into the drawing package, e.g., Visio, to effect generation of the wiring diagram pages.

Further related aspects of the invention provide such a method of automated diagram generation, e.g., as described above, in which, in addition to, or in lieu of, the import of control system programming (as described above), the wiring diagrams are generated from user input to a graphical user (GUI) or other interface.

Further related aspects of the invention provide such a method of automated diagram generation, e.g., as described above, as generates a cable schedule and/or wire labels pertaining to the wiring diagrams.

Further related aspects of the invention provide such a method of automated diagram generation, e.g., as described above, as provides novel techniques for interfacing commercially available drawing packages, such as Visio.

Further related aspects of the invention provide such a method of automated diagram generation, e.g., as described above, as inputs any programmatic description of a process (wiring, environmental or otherwise) and that generate wiring diagram-like illustrations therefrom.

Still further aspects of the invention provide digital data processors and/or digital data processing systems (peer-to-peer, client-server or otherwise) executing in according with a method, e.g., as described above.

These and other aspects of the invention are evident in the drawings and in the text that follows.

BRIEF DESCRIPTION OF THE DRAWINGS

A more complete understanding of the invention may be attained by reference to the drawings, in which:

FIG. 5 depicts further steps of the method of FIG. 3-4;

FIG. 10 depicts an example of SQL tables and columns generated during execution of a method in accord with one practice of the invention;

FIG. 11 depicts additional tables and their columns vis-a-vis those shown in FIG. 10;

FIG. 12 depicts additional tables and their columns vis-a-vis those shown in FIG. 10;

FIG. 13 depicts additional tables and their columns vis-a-vis those shown in FIG. 10;

FIG. 14 depicts additional tables and their columns vis-a-vis those shown in FIG. 10;

FIG. 15 depicts an example of system preference values in accord with one practice of the invention.

DETAILED DESCRIPTION OF THE ILLUSTRATED EMBODIMENT

Figure 1:
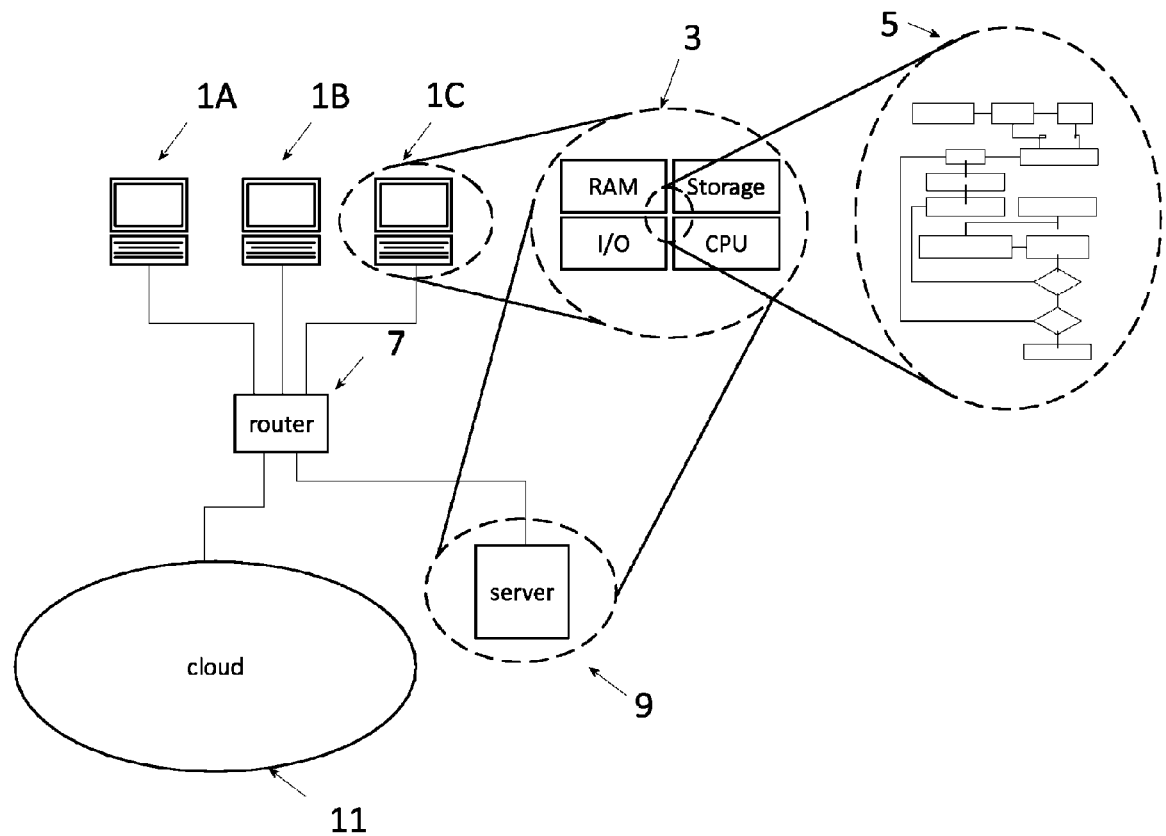
FIG. 1 depicts a system according to one practice of the invention.

FIG. 1 depicts a system for automated diagram generation according to one practice of the invention. The illustration depicts the system running on a desktop architecture, though it will be appreciated that the system can run on a peer-to-peer, client-server, remote server architecture or otherwise. Moreover, the discussion below largely focuses on embodiments in which the system is employed to generate a wiring diagram. However, it will be appreciated that the teachings herein can be applied to the generation of plumbing diagrams and other schematics.

The illustrated system includes digital data processors 1A, 1B, 1C that are coupled to server 9 via network 7 and that comprise conventional computing devices of the type commercially available in the marketplace, such as laptop computers, desktop computers, workstations, and so forth, as adapted in accord with the teachings hereof. It will be appreciated that one or more of these can be mobile computing devices, e.g., smart phones, personal digital assistants (PDAs), and so forth, as adapted in accord with the teachings hereof. As well, they can be embedded computing devices as adapted in accord with the teachings hereof. Regardless, the digital data processors can transmit and/or receive information via wired or wireless communications, all in the conventional manner known in the art as adapted in accord with the teachings hereof.

Illustrated devices, 1A, 1B, 1C each include central processing unit (CPU), memory (RAM), and input/output (I/O) subsections of the type commonly incorporated in respective devices of the type discussed above. Those subsections may include and execute (particularly, for example, in the case of the CPU) an operating system, a web browser and/or other software of the type commonly provided and configured for execution on such devices again, as adapted in accord with the teachings hereof.

Those subsections may, further, include and execute additional software, e.g., diagram generation software 5 according to the invention, the construction and operation of which is detailed below and shown in FIGS. 2-17. In other embodiments, that functionality may be consolidated within or distributed among one or more other digital data processors (illustrated or otherwise) without deviating from the teachings hereof. Regardless, that software is generally referred to below (e.g., in connection with FIGS. 2-17) as "the system," or the like.

The digital data processors, 1A, 1B, 1C may, further, include monitors/displays (not shown) of the type commonly used in respective devices of the type discussed above, e.g., for the display of information in web browsers, applications, apps or otherwise. And, those devices 1A, 1B, 1C can include keyboards (virtual, physical or otherwise) of the type commonly employed on such devices, e.g., for the input of information into web browsers, applications, apps or otherwise.

One or more of the devices 1A, 1B, 1C may include "local" storage for containing the user or other data associated with that respective digital data processor. This is illustrated in the drawing, by way of example, by storage in 3. Such a storage may be co-housed with the respective digital data processor, disposed in the vicinity of that respective digital data processor and/or on the same local area or other network and coupled by wire, wirelessly or otherwise, and/or may be disposed remotely and logically mounted on that digital data processor so that it functions as if a local storage for all intents and purposes relevant here, or otherwise.

The system can alternately be run on a server 9. The server 9 comprises a conventional digital data processor of the type commercially available such as a personal computer, workstation, mini computer, mainframe, and so forth, all as adapted in accord with the teachings hereof. Server digital data processor 3, too, may include central processing unit (CPU), memory (RAM), and input/output (I/O) subsections of the type commonly incorporated in respective devices of the type described above. Those subsections may include and execute (particularly, for example, in the case of the CPU) an operating system (or software) of the type commonly provided and configured for execution on such device, again, as adapted in accord with the teachings hereof. In the illustrated embodiment, those subsections may, too, include and execute the aforementioned diagram generation software 5 or portions thereof.

Figure 2:
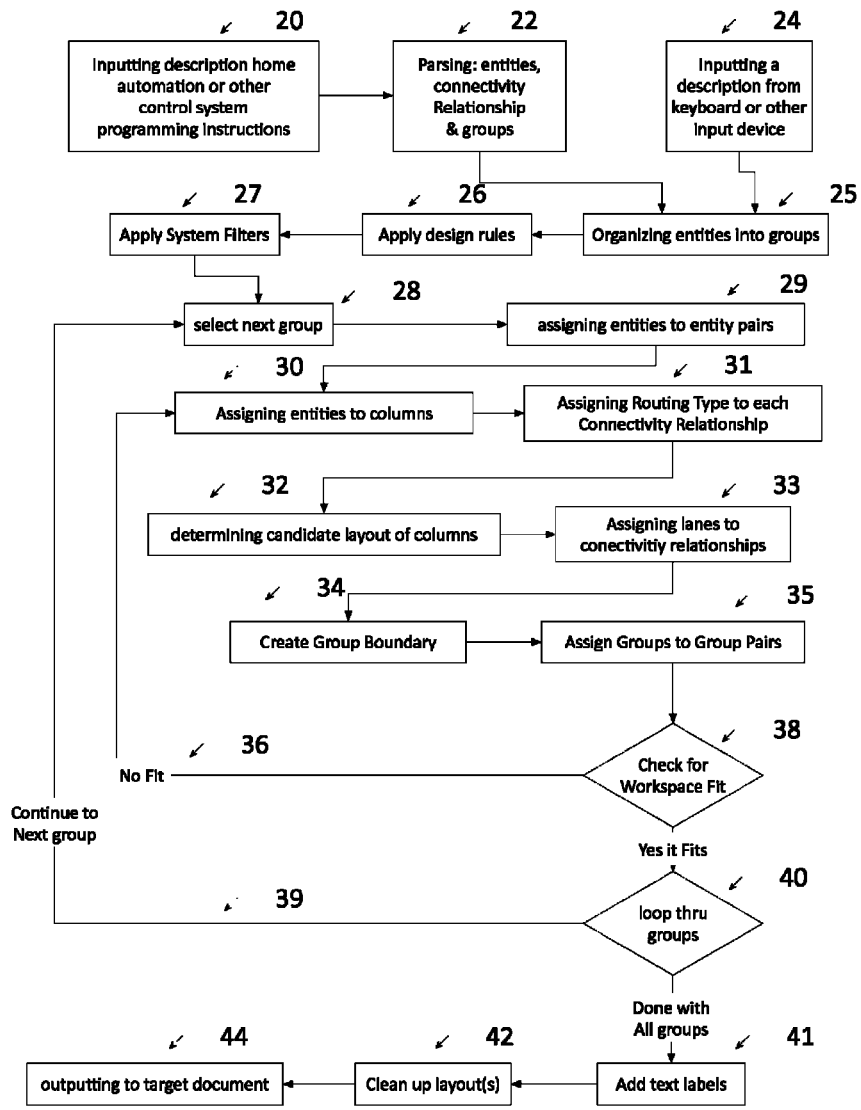
FIG. 2 depicts a methodology according to one practice of the invention for automatic diagram generation.

FIG. 2 shows a methodology for automatic diagram generation in accord with one practice of the invention for execution on a system of the type that is shown in FIG. 1 (and in particular for example a digital data processor 1A as shown in FIG. 1). This may be better appreciated with reference to the graphical illustration of system operation shown in FIG. 3.

In steps 20, 22, and 24, the system inputs a description which defines one or more of (i) a plurality of entities, (ii) connectivity relationships in which those entities participate with one another, (iii) location designation for each entity and (iv) available ports for each entity. The system can input these instructions from a file contained on disc drive or other storage device 52, or they can be entered by a user via keyboard 50 or other input device or otherwise. Alternatively or in addition, the system can permit a user to input the description via a graphical user interface (GUI), e.g., utilizing an editor presenting a Microsoft Visio-like interface or otherwise.

In the discussion that follows, without loss of generality, the term "devices" is used is used interchangeably with the term "entities," the term "cable" is used interchangeably with the term "connectivity relationships," the term "connection point" is used interchangeably with the term "ports," the term "locations" is used interchangeably with the term "groups," the term "pages" is used interchangeably with the term "workspaces," the term "programming instructions" is used interchangeably with the term "description."

In such an instance the entities can be for example Audio Video Devices for example for a home stereo system that are to be coupled with one another—and indeed or more precisely symbols that are to be presented in the output of the illustrated system are representative of such devices.

Figure 3:
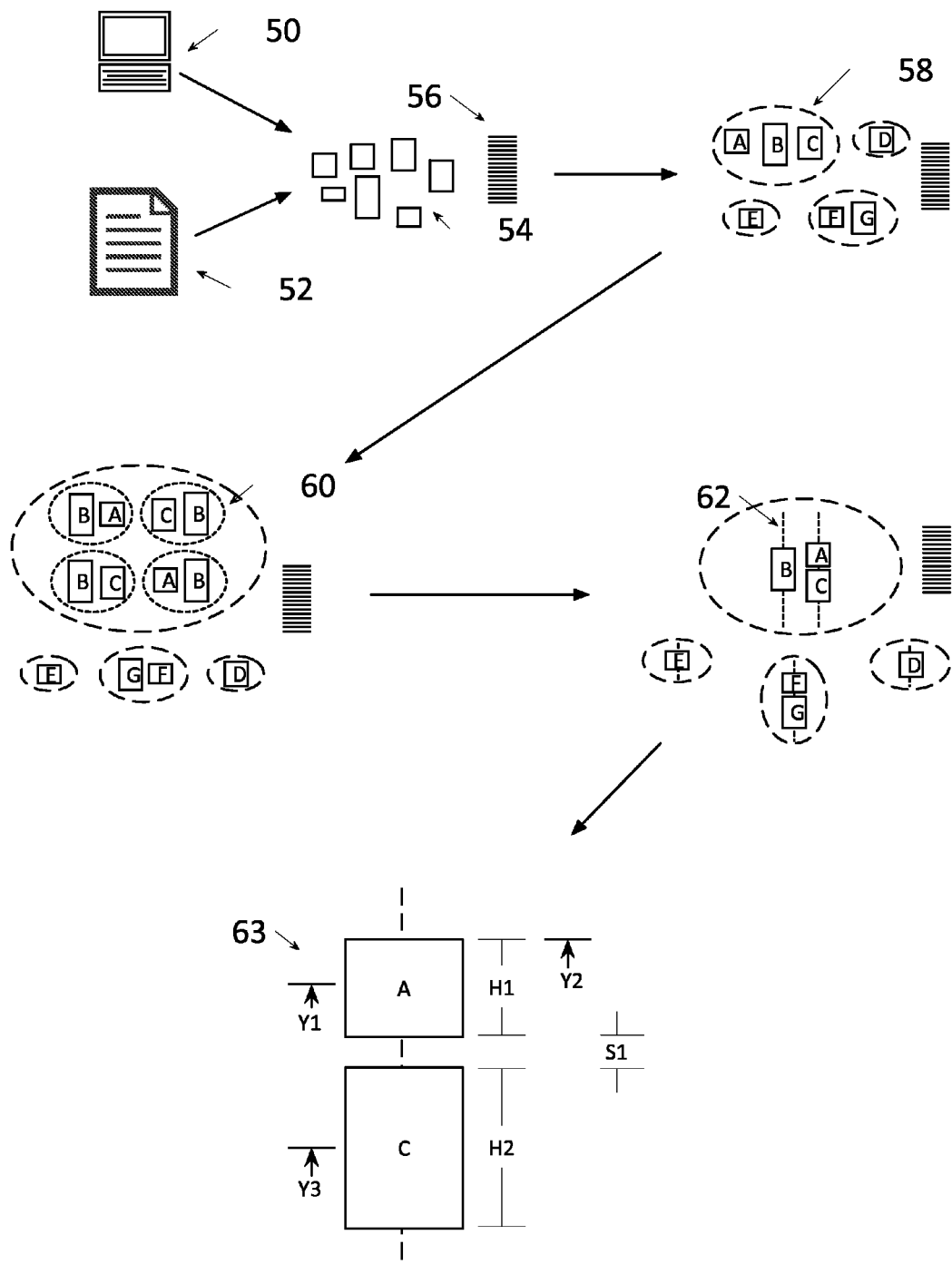
FIG. 3 is a graphical depiction of automatic diagram generation in accord with one practice of the invention.
Figure 4:
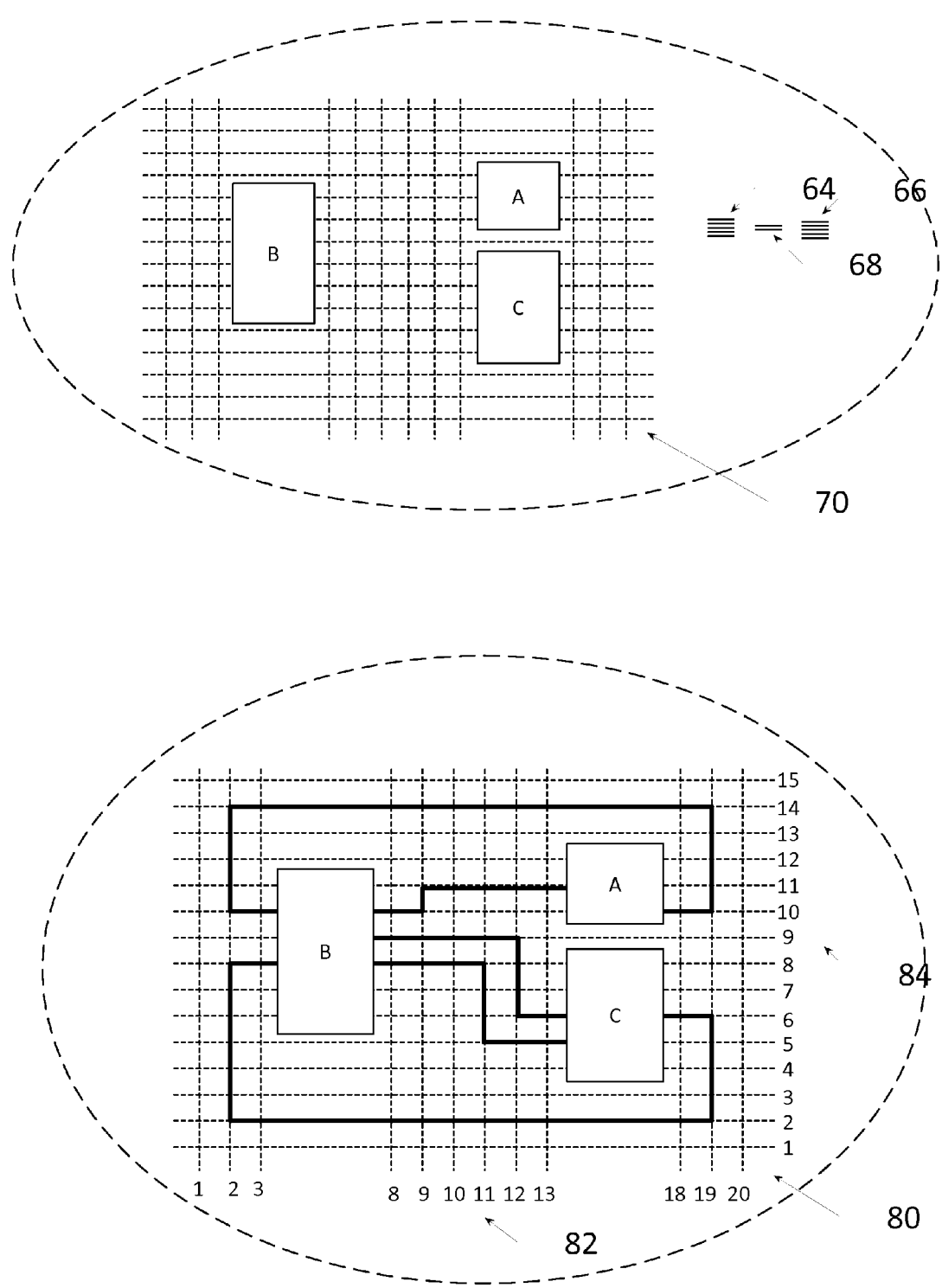
FIG. 4 depicts further steps of the method of FIG. 3.
Figure 6:
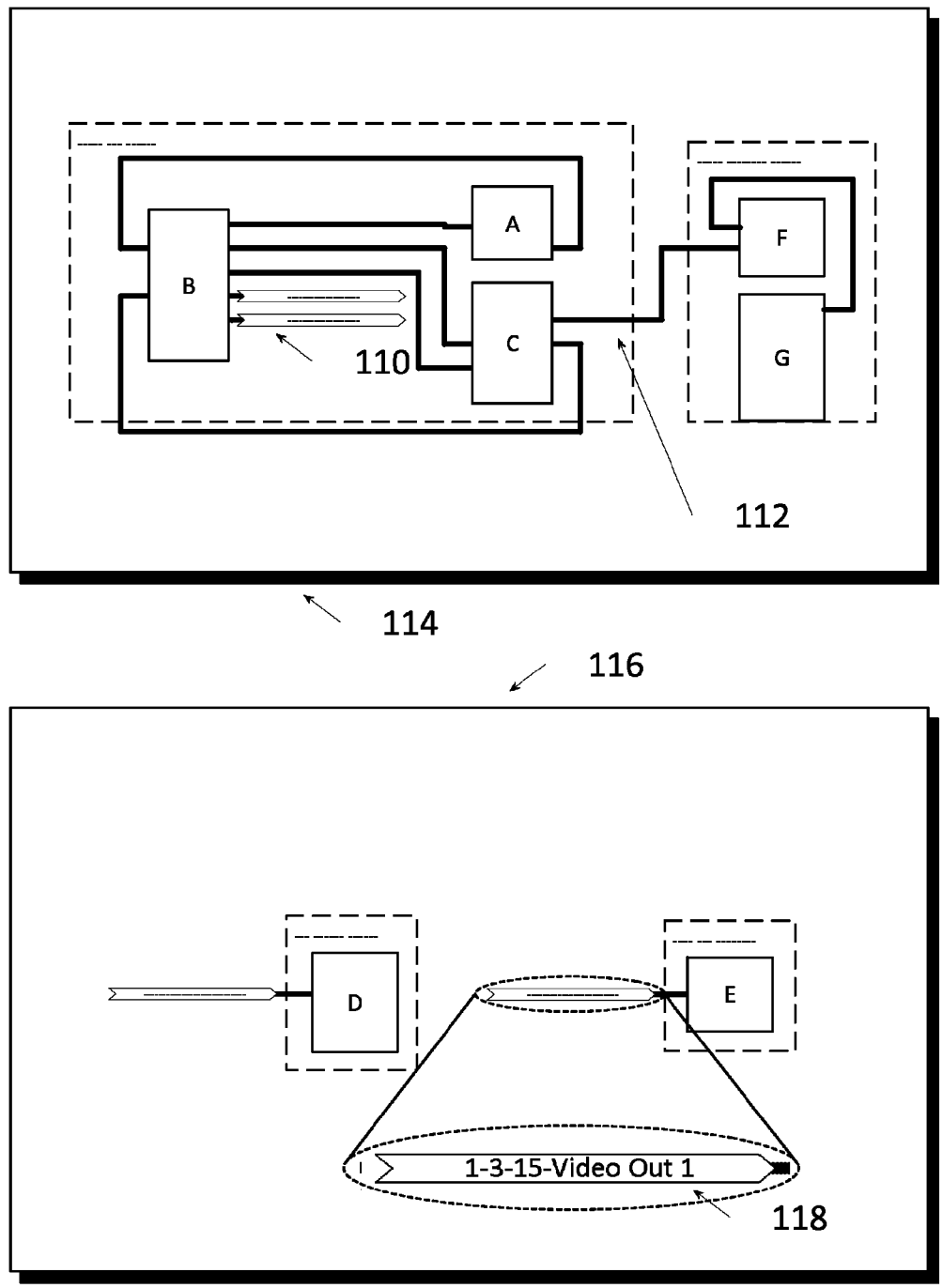
FIG. 6 depicts further steps of the method of FIG. 3-5.
Figure 7:
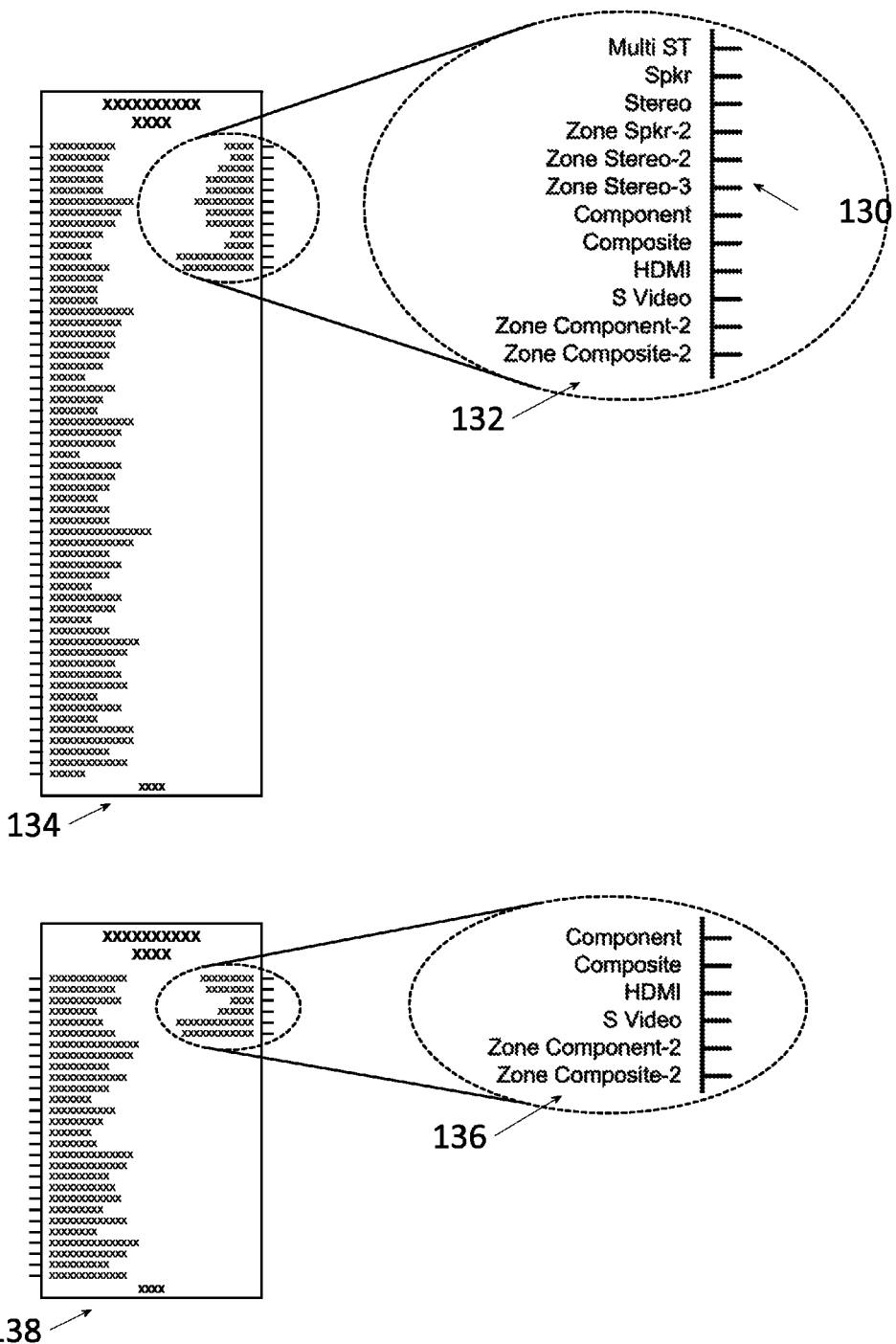
FIG. 7 depicts further steps of the method of FIG. 3-6.
Figure 8:
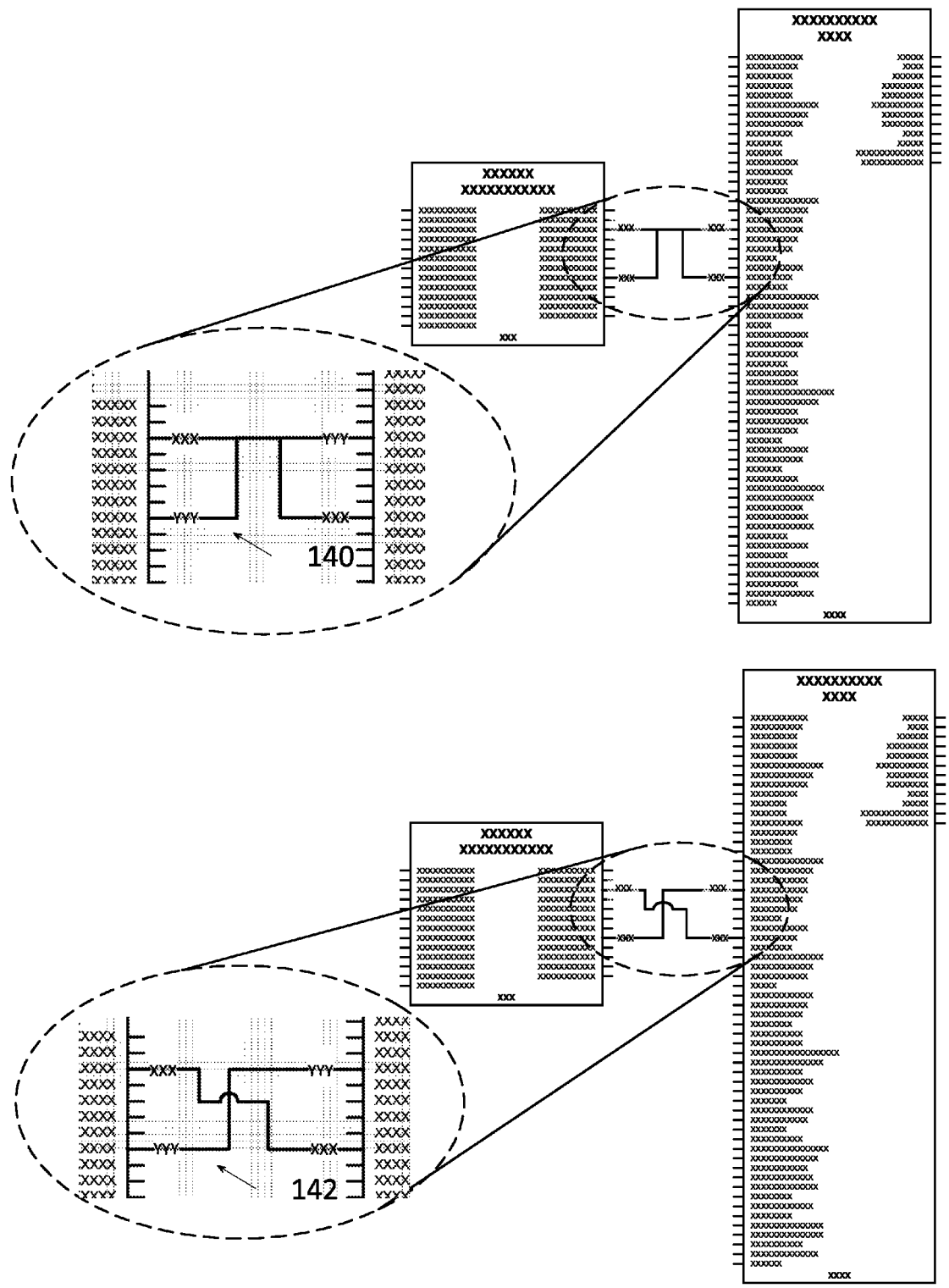
FIG. 8 depicts further steps of the method of FIG. 3-7.
Figure 9:
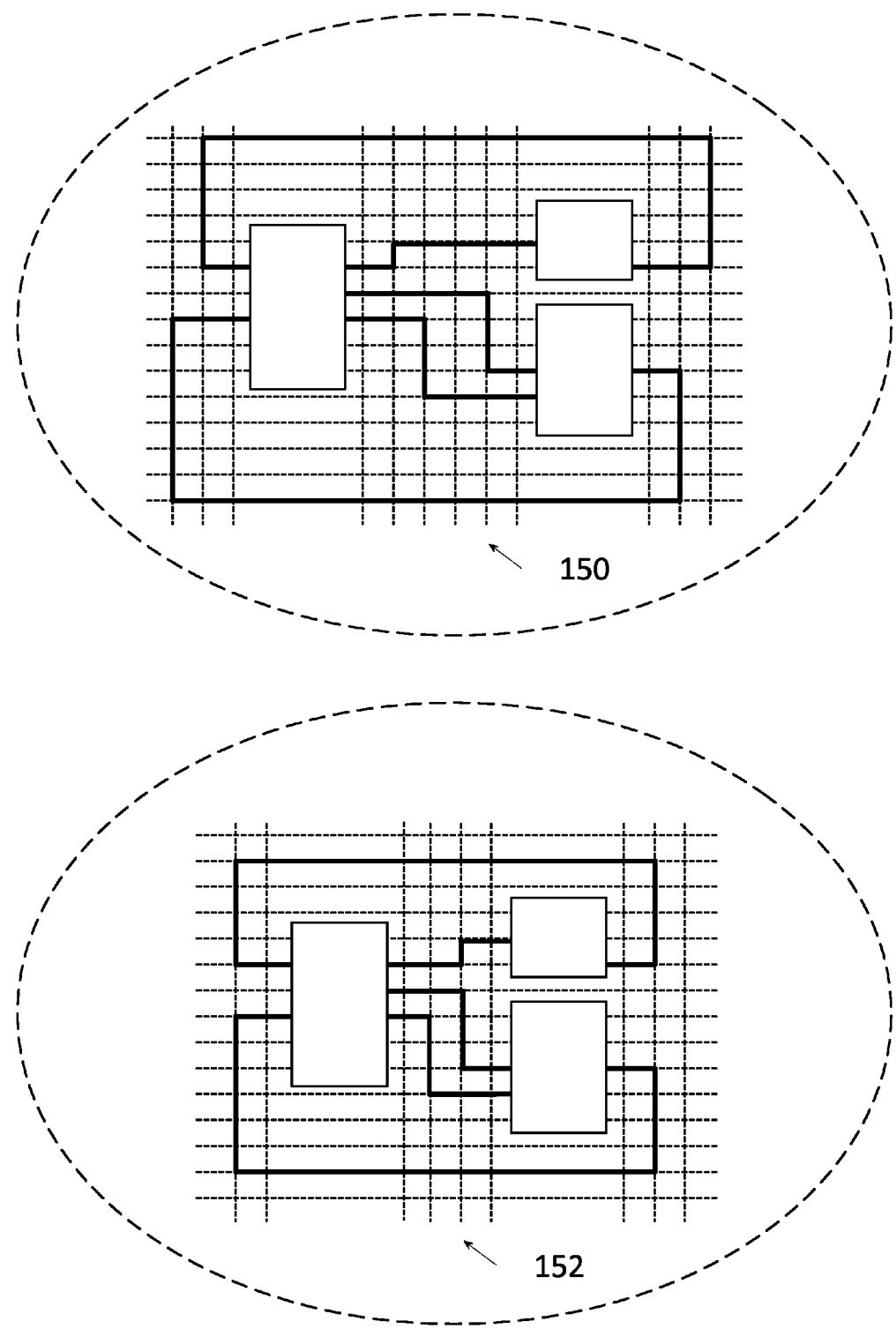
FIG. 9 depicts further steps of the method of FIG. 3-8.

In the illustrated embodiment, the description can be inputted by parsing a file containing programming instructions 22 from a home control system such as a Crestron, AMX, Control4, Savant or other control system (FIG. 3 reference 52). Of course it will be appreciated that in other embodiments the description can come from user input via a keyboard or other input device (step 24) (also FIG. 3 reference 50) or a computer file that represents a proposal, design or estimate or from another source such as Proposal Software, Estimating Software, Accounting Software, text editing software, or spreadsheet software.

In step 22 and step 24, after each Connection Point is input by the user (step 24) or parsed from the programming instructions (step 22), the system assigns a single directional classification to each connection point. In the Illustrated embodiment, directional Classifications are "Input," "Output," and "Bidirectional" (in other embodiments other classifications can be used instead or in addition).

In step 25, the system assigns devices to locations based on one of (i) the physical location of the entity as defined in the description, (ii) the categorization of the entity or (ii) another attribute. In such an instance the devices are assigned to locations where such devices are to be installed or located. A location can be a building, a floor, a room, an area within a room, a rack or other physical space. This is further illustrated in FIG. 3, element 58.

In step 26, the system applies design rules to supplement or modify information in the description. Design rules perform actions that may include one or more of (i) create "clouds" for various systems, (ii) add or delete devices, (iii) add or delete connection points to devices, (iv) add or delete cables (v) rename devices, cables or connection points, (vi) change the signal type for a cable or connection point, (vii) add additional locations (groups) to the project, (viii) enable or disable display of groups, devices, connections, or cables, or other action.

Clouds might represent, for example, (i) a distributed infrastructure such as cable tv, satellite, telephone or other system, (ii) a networkable infrastructure that needs to be served from centralized hubs, switches or other devices, such as Ethernet cables that all feed to one of (i) an Ethernet Switch, (ii) an Ethernet hub, (iii) an Ethernet router or another device.

Further to illustrate the application of Design Rules in step 26 here are some examples (i) The system should assign speakers to every room that has a stereo amplifier associated but has no speakers defined within that room, (ii) The system should assign both amplifier and speakers to every room that has a stereo preamplifier associated with it but does not have an amplifier or speakers defined in that room.

Figure 16:
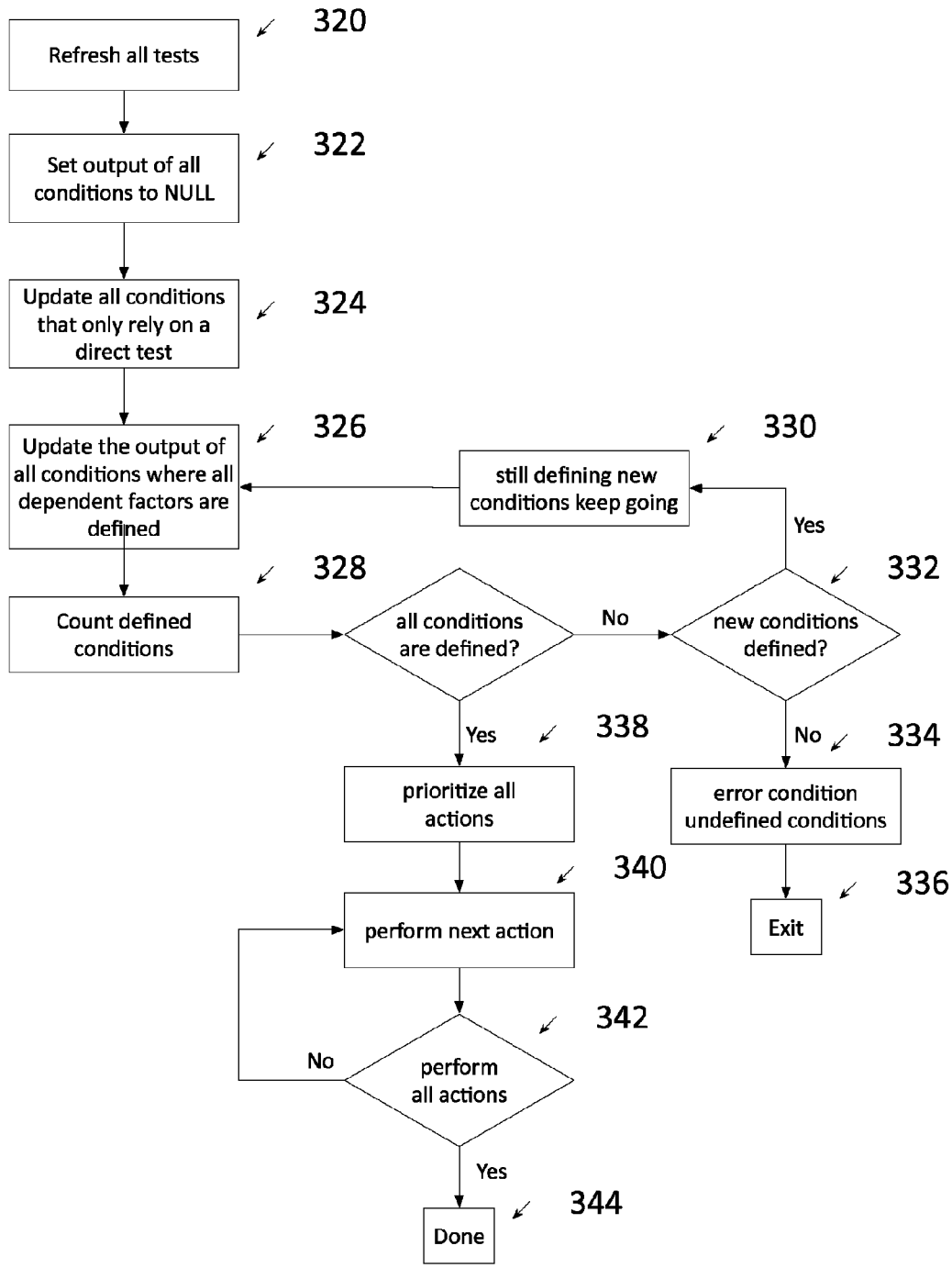
FIGS. 16-17 depict implementation of design rule in a method in accord with one practice of the invention.

FIG. 16 shows the required steps that the system follows to process design rules.

In the illustrated embodiment design rules are implemented using SQL tables representing "Rules," "Conditions," "Factors," "Actions," and "Attributes."

The Rules table stores a list of rules that are applied to a project. This is shown in FIG. 13 reference 232. Each Rule has a unique Rule_id and is assigned a rule_name. Rules can be enables by setting the enabled column to a value of 1.

The Conditions table stores information about the tests that are to be applied to determine what actions to perform. This is shown in FIG. 13 element 234. Each condition record has a unique Condition_id. Each condition contains one or more tests that are formatted in xml and stored in the test_xml column. Here is an example of test_xml data:

```
<test id='1' result_type="Boolean">
    <condition aggregate="all"></condition>
    <tests>
        <test id='2'>
            <condition
                result_type="Boolean"
                type="device exists"
                device_manufacturer = "ABC Industries"
                device_model="1234">
            </condition>
        </test>
        <test id='3'>
            <condition
                result_type="Boolean"
                type="device exists"
                device_manufacturer = "ABC Industries"
                device_model="1234ps"
                Invert_result="true">
            </condition>
        </test>
    </tests>
</test>
```

In the foregoing example the test is checking to see if one device exists but is missing a power supply. The first test (id="1") simply states that all child test must be true. Tests 2 and 3 are child nodes in the xml and hence child tests. In test 2 the system is instructed to look for an ABC Industries model 1234 anywhere in the project. In test 3 the system is instructed to look for the corresponding power supply, ABC Industries model 1234ps and because invert result is set to "true," test 3 is true if the power supply is not found. Tests can be nested as needed to create more complex tests.

The result of the tests can be a boolean, numeric or text value, however "actions" can only be triggered by conditions that have a boolean result_type of "true."

The workspace column in the conditions table is used for intermediate calculations.

Figure 17:
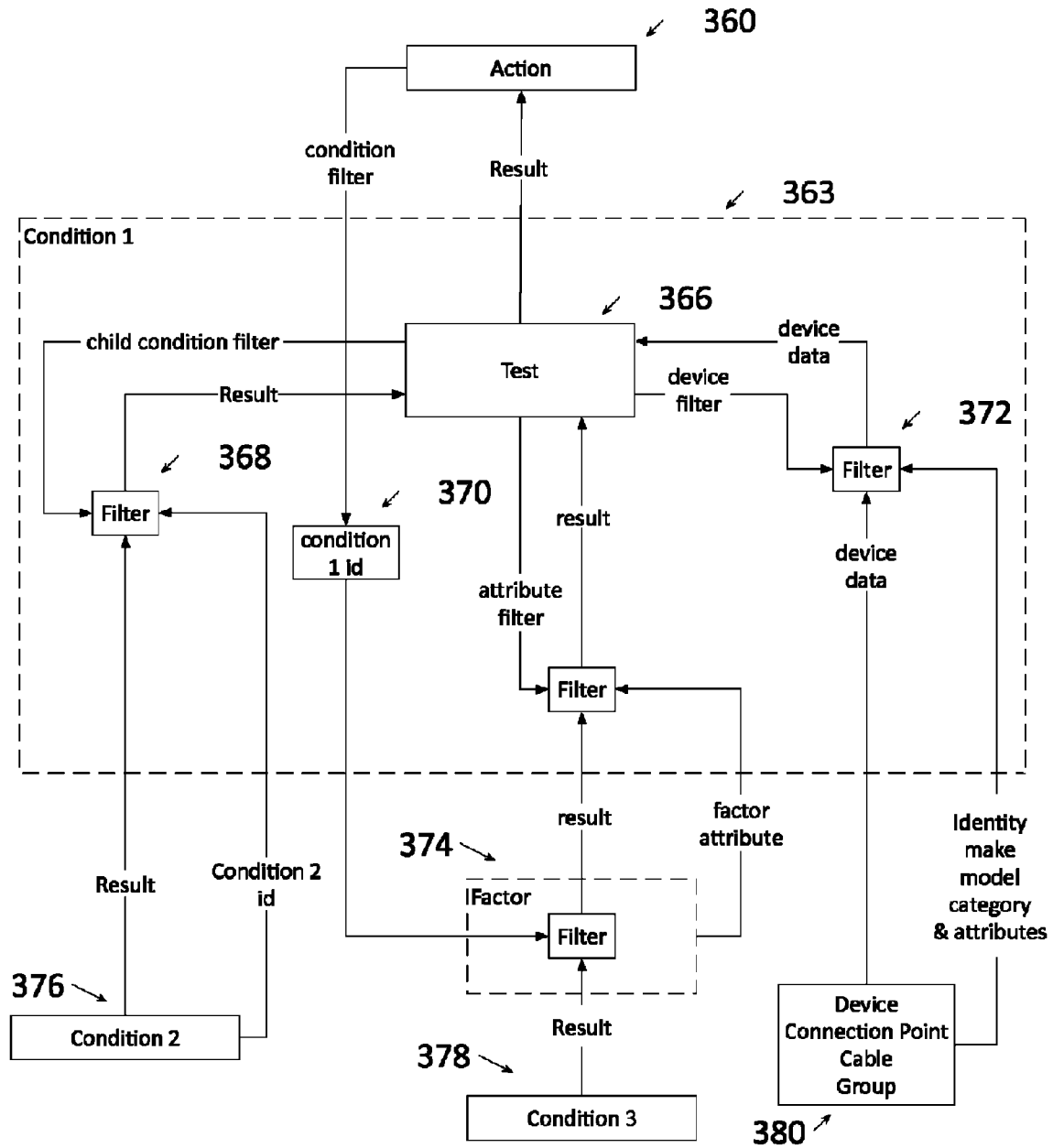

FIG. 17 shows how Conditions can be linked to Actions, Devices, Cables, Connection Points, Groups, and other Conditions.

Within a condition, the test can reference other (child) conditions by linking via child condition_id allowing some conditions to be used for intermediate calculations that are later used by other (parent) conditions.

Another way to link parent and child conditions is to use a "Factor." In database terms, Factors are a join table between Parent and Child conditions that provide additional flexibility than a specific reference to a child condition can provide. Factors are more flexible because they do not require the parent condition to explicitly point to each child condition. Instead of using the foreign id key to find children, factors can be assigned attributes that can be used to filter the conditions that are included in a test. For example perhaps there are conditions that measure a device's power consumption. By using factors that have a "Power" attribute, then a test can be easily created to measure the total power requirements by using the "Power" attribute in the test xml and by using the "Sum" aggregate function to total the power consumption of individual devices. Another benefit of using Factors is that Factor records can be created by design rules at run time, where test_xml is not as easily modified by the system.

The Factors table stores the information about Factors. This is shown in FIG. 14 reference 236. Each factor record has a unique Factor_id and foreign keys for associated parent and child conditions. Each Factor can be assigned an attribute that can be used to filter child conditions to be tested.

The system performs Actions when the Action's Requisite condition is met. Actions are described by an xml document. Here is an example of action_xml:

```
<action id='1' condition="1">
  <actions>
    <action
        id='2'
        type="add device"
        Manufacturer="ABC Industries"
        Model="1234ps">
    </action>
  </actions>
</test>
```

The actions table stores information about each action that can be performed. This is shown by FIG. 14 element 238. Each action record has a unique Action_id and a foreign key linking the requisite condition. The action description is stored in the Action_xml column.

The system can assign attributes to zero, one or more of devices, cables, groups, connection points, or cables or other items. This allows the system to filter which devices are tested in each condition's test.

The Attributes table contains information about Attributes. This is shown by FIG. 14 element 240. Each Attributes record has a unique Attribute_id and a foreign keys linking to associated Device, Connection Point, Cable or Location (Group). Each attribute record has an attribute name assigned. Attribute names are used in filtering Devices, Connection_Points, Cables, and Groups.

In step 27 the system applies system specific filters to connection points and cables that will be included in the diagram. A system specific filter is a broad classification of signal type, for example a system specific filter of "Video" can include one or more of (i) Composite Video, (ii) Component Video, (iii) HDMI, etc. When the system applies system specific filters, the system redraws devices to only show Connection Points that belong to the list of system specific filters. Also the system only includes cables that have signal types that are associated with the list of system specific filters. This results in creating a diagram that is more compact because it only shows information relevant to the selected systems.

In Step 28, the system selects the first (or next) group to work with.

In step 29, the system generates a list of device pairings from the description. A device pairing is a pair of devices that are connected via one or more cables where one device is connected via a connection point that has one directional classification and the other device is connected via a connection point that has another particular directional classification. This is further illustrated by FIG. 3 element 60. Note, there is a device pairing for B/A as well as a device pairing for A/B. These two pairings for the same two devices reflect the fact that there is a cable where A is Input and B is Output as well as a cable where A is output and B is input.

In the illustrated embodiment, the system creates a project file that represents a full description of the project. The project file is a SQL database, although in other embodiments the description can be stored in an array or an XML file or other file format. This is further illustrated in FIGS. 10, 11, 12 13, 14 and 15, by way of example.

The Devices (entities) table stores information about each device (entity) in the project. This is shown by FIG. 10 element 200. Each device will have a unique device_id. There are foreign keys to identify the associated location, page, column and Visio shape for the device. Input_Count and Output_Count record the number of input connection points and the number of output connection points. The number of connection points determines the height of the device symbol. Size and position on the page are stored in Height, Width, Pin_X, Pin_Y. There are columns for Manufacturer, Model_Number that are used on Excel reports and a column for Device_Name that is the name that is displayed on the device symbol.

The Connection_Points (ports) table stores information about each input or output connection point on each device. This is shown by FIG. 10 element 202. Each connection point is assigned a Connection_Point_id. There are foreign keys to identify the associated device, and Visio shape. Each symbol is assigned a directional_classification of "Input," "Output," "Bidirectional" or other. The assignment of Signal_Type determines compatibility between each connection point and cables and other connection points that said connection point can connect to. Compatibility can be determined by one or more of (i) electrical voltage, (ii) ac/dc/rf & frequency, (iii) signal protocol, (iv) the application for with the connection is used or other characteristics. The system classification is a broad classification that includes one or more signal types. Examples of system classification are: Audio, Video, Control, RF, etc. Each connection point has a connection name that is used in the diagram to label the port. Depending on signal type, or system classification each connection can be assigned a color. Connection_Position identifies the order that connection points are displayed on the device symbol. Connection_Positions are integers that start on either the left or right side of the symbol and count from position 1 forward going down the device symbol from top to bottom.

The Group_Boundaries table stores information regarding the rectangle symbol that represents the boundary of each group of devices that all share the same location on the diagram. This is shown by FIG. 10 element 204. Each Group_Boundary record has a unique Boundary_id as well as foreign keys to identify the associated group, page, and Visio shape. The Title_Text column stores the text that is used to label the boundary on the diagram. Position and size are stored in the height, width, pin_x and pin_y columns. Two opposing corner coordinates are identified in X1, Y1, X2, Y2 columns. When a group is too large to fit entirely on one page then the group will be split, among two or more pages. In this case the Is_Split_Group column is set to 1, and additional Group_Boundaries records are created for each page that the group is extended to.

The locations (groups) table stores information about each group of devices on the diagram that represent a location (or other common classification). This is shown by FIG. 11 element 210. Each location has a unique Location_id as well as a foreign key to the associated page. The member_count column represents the count of devices displayed in each group. The location_Name is used on reports and is used to set the Title_Text column in the Group_Boundaries table. The size required to accommodate devices and cables within a group is represented by the height and width columns. Pin_X and Pin_Y represent the center of shape symbols associate with a group or location.

The Group_Pairs table stores information about each of the possible combination of two groups that have cables that connect a device in one group to a device in the other group. This is shown by FIG. 11 element 212. Each group_pair record has a unique Group_Pair_id as well as foreign keys to the two associated groups. The cable_count column records the number of cables to connect the two groups. Cable_Count is used to rank Group pairs in order from most number of cables between groups to least number of cables between groups.

The Device_Pairs table stores a list of device pairings from the description. This is shown by FIG. 11 element 214. A device pair is a pair of devices that are connected via one or more cables where one device is connected via a connection point that has one directional classification and the other device is connected via a connection point that has another particular directional classification. Each device_pair record has a unique device_pair_id as well as foreign keys to the two associated devices. The cable_count column records the number of cables to connect the two devices.

The Columns table stores information about each of the columns with which devices are associated. This is shown by FIG. 11 element 216. Each column has a unique Column_id as well as foreign keys for associated Page, Group, and Sub_Group (in the case of split groups). The column width and height are determined by the width and height of devices in each column along with the placement of lanes that are associated with each column. The number of associated lanes on the left (input) side of the column and the number of associated lanes on the right (output) side of the column are stored in Left_Lanes_Count and Right_Lanes_Count. Top_Symbol_Starts_Y and Bottom_Symbol_Ends_Y are determined by the top and bottom device symbol in each column. Column position is an integer indicating the relative left/right placement of each column in relationship to other columns on the same page. Pin_X is the left/right center-point of the column.

In the Pages (workspaces) table the Page_Name column is the name displayed in the page tab. This is shown by FIG. 12 element 218. If the document is subdivided into sections then pages will be identified by Section_Number & i-i & Section_Page_Number where the section_Page_Number is the page number within the section. Document page number is the actual page number within the entire document. Page_id is the reference id for the page section of the XML document that the system exports.

The Cables (connectivity relationships) table stores information about each cable on the project. This is shown by FIG. 12 element 220. Each Cable has a unique Cable_id as well as foreign keys for the "from device," "from connection point," "to device," "to connection point," "input jump" (optional), "output jump" (optional) and the Visio shape. The x/y position of the "to" and "from" connection point are recorded in Input_Connection_Point_X, Input_Connection_Point_Y, Output_Connection_Point_X, and Output_Connection_Point_Y. The assignment of Signal_Type determines compatibility between the cable and connection points that they can connect to. The system classification is a broad classification based on signal type. Examples of system classification are: Audio, Video, Control, RF, etc. Depending on signal type, or system classification each cable can be assigned a line_color and a line_style.

The page_jumps table records information about page_jumps that connect cables the span from a device on one page to a device on another page. This is shown by FIG. 12 element 222. Page jumps are created in pairs, with one located next to each of the two devices that the cable connects to. Each Page_Jump record has a unique Jump_id as well as foreign keys for associated Cable, Local_Page, Remote_Page, local_device, remote device, local Visio shape, and remote Visio shape. Local_jump_text and remote_jump_text are used to create the text labels that display on the page jump. Typically jump text is displayed in this format: [remote page number] & "-" & [remote group number] & "-" & [remote device id] & "-" & [remote connection name]. The position of the jump is stored in Pin_X and Pin_Y. A jump that connects to an input connection point will be assigned a directional_classification of "input." A jump that connects to an output connection point will be assigned a directional_classification of "output."

The lanes table records information about each lane segment assignment. One or more lane segments are assigned to each cable to trace the path from output connection point to input connection point or from output connection point to page jump or from page jump to input connection point. This is shown by FIG. 13 element 230. Each lane segment has a unique Lane_id and has foreign keys for the associated column, page, and cable. Each segment is assigned a segment_id based on its position on the associated cable in relationship to other lane segments associated with the same cable. Lane orientation can be "Vertical" or "Horizontal." Vertical lanes have a left/right center-point: X and span from Y1 to Y2. Horizontal lanes have an up/down center-point: Y and span from left/right X1 to X2. Vertical Lanes have a plus or minus Lane_Relative value describing the lanes position in relation to the lane's associated column. Lanes to the right of their associated column are assigned positive Lane_Relative values and lanes to the left of their associated column are assigned negative Lane_Relative values. Horizontal lanes have an Lane_Absolute reflecting the lane position of the lane in respect to the top or bottom of the page.

The system stores preference values in one of (i) one or more preferences tables, (ii) an .ini file stored on disc, (iii) an array in memory or by some other method. The initial preference values may be set by the system. In addition the user may modify these Preference values. An example of the values that are stored is shown by FIG. 11 element 240.

One way to generate the list of device pairings is to perform this SQL query:
SELECT DISTINCT Input_Device_id, Output_Device_id FROM Cables.

Device Pairs are ranked based one more or more of (i) the number of cables that connect one member of a device pair to the other member of the device pair, (ii) the number of connections points for each device within a device pair or other factors.

In step 30, the system assigns each device within a group to a column. The system iterates though the list of device pairs in order of rank descending and attempts to make column assignments that will keep device pairs together, either side by side or one above the other. This step is further illustrated by FIG. 3 element 62. The Y position of the center of the device is also determined at this time. One way to calculate the Y position of the center of the device is to use the following formula:

When new Device is placed below existing device:
$$Y3 = Y1 - (H1/2) - S - (H2/2)$$

When new Device is the first device placed into the top of the column: $Y3 = Y2 - (H2/2)$ Where:
Y1 is the Y Position of the center of the device directly above the new device to be added (if this is not the first device placed into this column);
Y2 is the Y coordinate of the top of the Column;
H1 is the Height of the Device directly above the Device to be added;
H2 is the Height of the Device to be added;
S is the "Default Vertical Space Between Devices within Column" read from Preferences table; and
Y3 is the Y coordinate of the center of the new Device.
This step is further illustrated by FIG. 3 element 63.

In step 31, the system assigns routing types to each cable. Routing Types can be one of (i) "In Group Adjacent," (ii) "In Group," (iii) "Remote Group," (iv) "Remote Group Jump," (v) "Split Group Jump." This is further illustrated in FIG. 2 element 31, FIG. 4 elements 64, 66 and 68, FIG. 5 elements 92, 94, 96, 98 and FIG. 6 element 110. The system assigns an "In Group Adjacent" designation 92 when the cable connects two devices in the same group where the input device is in the column immediately to the right of the column containing the output device. The system assigns an "In Group" designation 96 when the cable connects two devices in the same group but "In Group Adjacent" requirements are not met. The system assigns "Remote Group" designation 94 when the cable connects two devices that are in different groups but both device are located on the same workspace (page). The system assigns "Remote Group Jump" designation 110 when the cable connects two devices that are in different groups and the groups are located on different workspaces (pages). The system assigns "Split Group Jump" designation when the cable connects two devices that are in same group but because the group is too large to fit on a single workspace, the group is split and the two devices that the cable connects are located on different pages.

In step 32 and 33, the system determines a candidate layout for columns and associated devices and cables within the group by assigning one or more lanes to each cable that will connect the candidate devices in that column. Together all of the lanes for a particular cable trace the path from the output connection point on the output device to the input connection point on the input device. In the illustrated embodiment the lanes assignments are stored in a "Lanes" table in the SQL database, however in other systems this information can be stored in a different format or location. The system selects lanes where the cable will not overlap another cable. In other words no two cables share the same lane segment.

One method to test a lane assignment for lane overlap is to use one of the following tests:

Vertical lane segments do not conflict when this formula resolves to be true:

X1<>X2 OR MAX (Y1,Y2)<MIN (Y3,Y4) OR MIN (Y1, Y2)>MAX (Y3,Y4)

To test a vertical lane segment for overlap condition:

Where a lane segment traces a path from Cartesian Coordinates x1,y1 to x1,y2, testing for conflict with another vertical lane segment that traces the path from x2,y3 to x2,y4.

To test a horizontal lane segment for overlap condition:

Horizontal lane segments do not conflict when this formula resolves to be true:

Y5< >Y6 OR MAX (X6, X7)<MIN (X8,X9) OR MIN (X6, X7)>MAX (X8,X9)

Where a lane segment traces a path from Cartesian Coordinates x5,y5 to x6,y5 then testing for conflict with another horizontal lane segment that traces the path from x8,y6 to x9,y6.

In step 34 the system creates a Group Boundary symbol 103 which identifies which devices are part of each group on the drawing. The system assigns a label to the Group Boundary symbol that includes one or more of (i) the group number, and/or (ii) the group name.

In step 35, the system generates a list of all possible group pairs. A group pair is a pair of groups that are connected via one or more cables where one device is located in the first group and the other device is located in the second group. Group pairs are ranked based on the number of cables that connect groups in each group pair. This ranking is used to prioritize placement of groups onto pages that have the maximum number of connections to the group being placed.

In Step 38 the candidate layout is checked for fit to available workspaces. To do this the size of each group is estimated with this formula:

$$\text{Group Height} = (\text{Top} - \text{Bottom}) + \text{Additional\_Horizontal\_Lane\_Estimate}$$

$$\text{Group Width} = \text{Left} - \text{Right} + \text{Additional\_Vertical\_Lane\_Estimate}$$

Where:
"Top Allowance"=Device Top Vertical Allowance from system/user preferences;
"Bottom Allowance"=Device Bottom Vertical Allowance from system/user preferences;
"Lane Spacing"=Default Vertical Space Between Devices within Column from system/user preferences;
Devices have Height of "H" and Width of "W";
"H"=Lane Spacing*Max(Number of Input Lanes, Number of Output Lanes)+Top Allowance+Bottom Allowance;
"W"=Fixed amount determined by user preference. Typical value might be 20*Lane Spacing;
"J"=Page Jump Width from system/user preferences;
Device has a center point located at X9, Y9;
Horizontal Lanes segments have a Y coordinate of Y1 and span from X2 to X3;
Vertical Lanes segments have a X coordinate of X1 and span from Y2 to Y3;
Additional_Horizontal_Lane_Estimate is determined by the number of Cables in a particular group that have a routing type of Remote Group, Remote Group Jump or Split Group Jump.;
Additional_Vertical_Lane_Estimate is determined by the number of Cables in a particular group that have a routing type of Remote Group, Remote Group Jump or Split Group Jump.;
Top=MAXIMUM VALUE OF Y1, Y2, Y3, Y9+H/2;
Bottom=MINIMUM VALUE OF Y1, Y2, Y3, Y9-H/2;
LEFT=MINIMUM VALUE OF X1, X2, X3, X9-W/2; and
RIGHT=MAXIMUM VALUE OF X1, X2, X3, X9+W/2.

The system repeats steps 30 thru 38 for the candidate layout for the current group to find a candidate layout that fits the available workspace(s).

The system repeats steps 28 thru 40 for each group until all of the candidate layouts fit the available workspace(s).

In step 41 of the illustrated embodiment the system adds text labels to the various shapes and symbols that represent one or more of (i) devices, (ii) connection points, (iii) cables, (iv) group boundaries, (v) page title block, and/or other shapes and symbols.

In step 42, of the illustrated embodiment the system applies a final set of adjustments. These adjustments may include one or more of (i) Tighten horizontal and vertical lane assignments to remove white space or unused lane positions (FIG. 9 elements 150 and 152), (ii) correct adjacent lane conflicts (FIG. 8 elements 140 and 142), (iii) clean up connection point names.

The system cleans up connection point names by one or more of (i) applying renaming rules, (ii) Checking for and eliminating word redundancy, (iii) looking up connection name text in a connection name substitution database and applying the substitute text.

Once the candidate layout(s) fits the available workspace(s) then the system outputs the diagram to the target document (step 44). In the illustrated example the target document is an XML Microsoft Visio document but in other embodiments the target document can be one of (i) DWG CAD document, (ii) DXF CAD document, (iii) PDF document, or a document of another format. In other embodiments the diagram can be output (plotted) to a paper printout and/or displayed on a monitor of computer 10.

In step 44 of the illustrated document the system creates the target document by assembling chunks of XML that represent the various shapes that compose the finished document. These shapes may include symbols representing one or more of (i) devices, (ii) connection points, (iii) cables, (iv) location boundaries, (v) title blocks, (vi) page jumps and/or other symbols. Values are inserted into the XML chunks as the document is assembled. Values may include one or more of (i) ids, (ii) dimensions, (iii) x/y coordinates, (iv) text to be displayed, (v) shape color information, (vi) shape style information, (vii) page information, (viii) descriptions of reusable symbol descriptions (masters), or other information.

In step 44 of the illustrated document the system also may (depending on user preference) create one or more of (i) a cable schedule sorted by cable number, (ii) a cable schedule sorted by location, (iii) wire labels, (iv) bill of materials (devices), (v) IP address table, (vi) cable connector list, (vii) power requirements report or other report. In the illustrated example these reports are created in the form of an Excel spreadsheet file with multiple tabs, but in other embodiments, this report can be (i) a PDF, (2) Word document, (iii) a csv or other delimited file, (iv) multiple spreadsheets or another format.

The construction and operation of systems and methods according to the invention may be attained by reference to the code listing provided Appendix A hereof, as well as to the code listing provided in the Attachment to the parent hereof, incorporated-by-reference U.S. Patent Application Ser. No. 61/538,632, filed Sep. 23, 2011, the aforementioned code listings of which are written in the AutoIt, v. 3, a publicly available open source language.

Described above and shown in the drawings are systems and methods meeting the aforementioned objects, among others. It will be appreciated that the illustrated embodiment(s) are merely examples of the invention and that other embodiments incorporating changes therein fall within the scope of the invention. Thus, for example, it will be appreciated that the figures and formula above are with respect to the illustrated embodiment and that other embodiments may differ in these regards.

In view of the foregoing, what we claim is:

1. A method of automated diagram generation comprising executing on one or more digital data processors the steps of:
   A. inputting a description of
      (i) a plurality of entities;
      (ii) connectivity relationships in which those entities participate with one another, wherein each entity includes one or more symbols representing ports that depict the termination of one or more connectivity relationships;
   B. assigning a signal type classification to the symbols representing ports, said classification being used to determine compatibility between each port and other ports that share the same or compatible classification, said compatibility being determined by one or more of
      i. electrical voltage,
      ii. ac/dc/rf & frequency,
      iii. signal protocol, and
      iv. the application for which the connection is used;
   C. assigning the entities to each of one or more groups of entities ("groups");
   D. assigning the entities to each of one or more columns, where each column has one or more lanes;
   E. determining a candidate layout of columns for placement into one or more workspaces based on widths assigned to those columns;
   F. assigning connectivity relationships of one or more entities in at least one column to each of one or more lanes based on the column(s) to which entities participating in those connectivity relationships are assigned, and assigning widths to at least one of the columns as a function of those lane assignments;
   G. repeating at least one of steps (D), (E) and (F) until a said candidate layout has a placement of columns that fits into one or more workspaces;
   H. outputting a representation of the candidate layout that fits into the workspaces, and
   I. assigning the symbols representing ports a directional classification selected from the group consisting of "Input," "Output," and "Bidirectional".

2. The method of claim 1, wherein step (H) includes outputting the representation of the candidate layout such that any of:
   i. one or more of the connectivity relationships is depicted by a symbol representing a wire,
   ii. each workspace is placed on a separate respective page,
   iii. one or more of the entities is depicted by a symbol representing an electronic device,
   iv. one or more of the groups depict a physical location where electronic devices are located,
   v. each entity includes one or more symbols representing ports that depict the termination of one or more connectivity relationships,
   vi. one or more of ports represent electrical or electronic connectors, and
   vii. the layout is an electronic schematic.

3. The method of claim 1, wherein step (A) further includes inputting the description using a graphical user interface.

4. The method of claim 1, wherein step (A) further includes parsing a home automation or other control system programming instructions.

5. The method of claim 4, wherein step (A) further includes identifying in the programming instructions any of entities, connectivity relationship in which the entities participate, and one or more groups in which the entities are to be assigned.

6. The method of claim 5, wherein one or more of the entities include ports, and wherein
   step (A) includes the further step of assigning designations to those ports,
   step (H) includes outputting the representation of the candidate layout to include text or other symbols based on those designations.

7. The method of claim 1 further comprising selecting lanes assigned to a connectivity relationship that do not overlap with any other connectivity relationship.

8. The method of claim 1 applying adjustments to the candidate layout that may include any of (i) tightening horizontal and vertical lane assignments to remove white space or unused lane positions and (ii) correcting adjacent lane conflicts.

9. The method of claim 1, further comprising adding text labels to the various shapes and symbols that represent one or more of (i) devices, (ii) connection points, (iii) cables, (iv) group boundaries, (v) page title block, and/or other shapes and symbols.

10. The method of claim 1, comprising the step of cleaning up connection point names. The system deans up connection point names by one or more of:
   (i) applying renaming rules;
   (ii) checking for and eliminating word redundancy;

(iii) looking up connection name text in a connection name substitution database and applying the substitute text.

11. A method of automated diagram generation comprising executing on one or more digital data processors the steps of:
A. inputting a description of (i) a plurality of entities and (ii) connectivity relationships in which those entities participate with one another;
B. assigning a signal type classification to the symbols representing ports, said classification being used to determine compatibility between each port and other ports that share the same or compatible classification, said compatibility being determined by one or more of:
   i. electrical voltage,
   ii. ac/dc/rf & frequency,
   iii. signal protocol, and
   iv. the application for which the connection is used;
C. assigning the entities to each of one or more groups of entities ("groups"), and assigning ranks to each of one or more pairings of entities within each of one or more groups, wherein the ranks are assigned as a function of a number of connectivity relationships in which the entities in each pairing jointly participate;
D. assigning the entities to each of one or more columns, where each column has one or more lanes;
E. determining a candidate layout of columns for placement into one or more workspaces based on widths assigned to those columns;
F. assigning connectivity relationships of one or more entities in at least one column to each of one or more lanes based on the column(s) to which entities participating in those connectivity relationships are assigned, and assigning widths to at least one of the columns as a function of those lane assignments;
G. repeating at least one of steps (D), (E) and (F) until a said candidate layout has a placement of columns that fits into one or more workspaces;
H. outputting a representation of the candidate layout that fits into the workspaces; and
I. assigning the symbols representing ports a directional classification selected from the group consisting of "Input," "Output," and "Bidirectional".

12. The method of claim 11, wherein step (F) further includes the step of iteratively assigning positions to lanes in order to prevent lanes that are assigned to different respective connectivity relationships from having a same position in a representation of a candidate layout.

13. The method of claim 11, wherein
step (D) further includes the step of assigning or re-assigning each connectivity relationship to a routing type selected from a group of routing types that includes the types:
(i) "In Group Adjacent,"
(ii) "In Group,"
(iii) "Remote Group,"
(iv) "Remote Group Jump,"
(v) "Split Group Jump,"
step (D) further includes the step of sorting connectivity relationships by routing type, and
step (D) partially determines column width based on the number of connectivity relationships within each routing type.

14. The method of claim 13, wherein
step (D) includes a step where the user inputs any of a page size and page scaling factor,
step (E) takes into consideration the page size and scaling factor in determining a candidate layout of columns for placement into one or more workspaces,
step (E) determines the available workspace area based on the page size and scaling factor, and
step (E) further determining if the largest entity representation will fit with available workspace area.

15. The method of claim 14, wherein
step (F) includes assigning page jumps ("jumps") to connectivity relationships that connect 2 entities that are located on different workspaces, and
step (F) re-calculates column widths and lane assignments for columns that are associated with connectivity relationships that have been assigned jumps.

16. The method of claim 14, comprising assigning a split group jump designation to a connectivity relationship directed to two (or more) entities that are in such a split group.

17. The method of claim 11, wherein one or more of:
step (A) further includes inputting signal types to be displayed via graphic user interface,
step (D) further includes assigning a signal type to each port,
step (D) further includes filtering ports to be displayed based on the list of signal types,
step (D) further includes a step of assigning a signal type to each connectivity relationship,
step (D) further includes a step of filtering connectivity relationships to be displayed based on the list of signal types, and
step (D) further includes a step of adjusting a candidate layout based on the ports and connectivity relationships.

18. The method of claim 11, comprising splitting a group such that the entities therein are placed on different respective workspaces.

19. A method of automated diagram generation comprising executing on one or more digital data processors the steps of:
A. inputting a description of (i) a plurality of entities and (ii) connectivity relationships in which those entities participate with one another;
B. assigning a signal type classification to the symbols representing ports, said classification being used to determine compatibility between each port and other ports that share the same or compatible classification, said compatibility being determined by one or more of:
   i. electrical voltage,
   ii. ac/dc/rf & frequency,
   iii. signal protocol, and
   iv. the application for which the connection is used;
C. any of
(i) defining and/or removing one or more entities and/or connectivity relationships,
(ii) defining and/or removing one or more groups,
(iii) defining and/or removing one or more ports that reflect termination of one or more connectivity relationships as a function of one or more rules;
D. assigning the entities to each of one or more groups of entities ("groups");
E. assigning the entities to each of one or more columns, where each column has one or more lanes;
F. determining a candidate layout of columns for placement into one or more workspaces based on widths assigned to those columns;
G. assigning connectivity relationships of one or more entities in at least one column to each of one or more lanes based on the column(s) to which entities participating in those connectivity relationships are assigned, and assigning widths to at least one of the columns as a function of those lane assignments;

H. repeating at least one of steps (E), (F) and (G) until a said candidate layout has a placement of columns that fits into one or more workspaces;
I. outputting a representation of the candidate layout that fits into the workspaces;
J. assigning the symbols representing ports a directional classification selected from the group consisting of "Input," "Output," and "Bidirectional".

20. The method of claim 19, comprising executing at least one of steps (A)-(J) in accord with a filter that is based on signal or other type.

21. The method of claim 19, wherein step (I) includes outputting one or more of: a schedule of connectivity relationships depicted in an output candidate layout sorted by identifier, a schedule of connectivity relationships depicted in an output candidate layout sorted by location, identifiers for wiring or other connectivity relationships realized in the candidate layout, a bill of materials for components realized in the candidate layout, an enumeration of IP addresses for components realized in the candidate layout, a cable connector list for a layout realized in the candidate layout, power requirements for a candidate layout.

22. The method of claim 19, that includes prioritizing placement of groups into workspaces based on numbers of entities participating in connectivity relationships within those groups.

23. The method of claim 19, comprising identifying pairs of groups that have one or more entities participating in mutual connectivity relationships and that ranks such pairs as a function of the numbers of those relationships.

24. The method of claim 19, comprising defining entities and/or connectivity relationships as a function of one or more rules.

25. The method of claim 24, comprising any of:
(i) defining one or more additional entities and/or connectivity relationships, and
(ii) removing one or more additional entities and/or connectivity relationships, based on those entities and/or connectivity relationships specified in the description.

26. The method of claim 19, wherein the outputting step includes depicting the candidate layout on any of a printout and a computer screen.

\* \* \* \* \*